United States Patent
Tsuji

(10) Patent No.: US 11,070,217 B2
(45) Date of Patent: Jul. 20, 2021

(54) PHASE LOCKED LOOP CIRCUIT

(71) Applicant: ROHM Co., LTD., Kyoto (JP)

(72) Inventor: Masanobu Tsuji, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 17/104,274

(22) Filed: Nov. 25, 2020

(65) Prior Publication Data

US 2021/0159905 A1 May 27, 2021

(30) Foreign Application Priority Data

Nov. 26, 2019 (JP) .............................. JP2019-213528

(51) Int. Cl.
*H03L 7/099* (2006.01)
*H03L 7/081* (2006.01)
*H03L 7/089* (2006.01)
*H03L 7/093* (2006.01)

(52) U.S. Cl.
CPC ............ *H03L 7/0995* (2013.01); *H03L 7/081* (2013.01); *H03L 7/089* (2013.01); *H03L 7/093* (2013.01); *H03L 7/0992* (2013.01)

(58) Field of Classification Search
CPC ....... H03L 7/081; H03L 7/0995; H03L 7/089; H03L 7/093; H03L 7/0992
USPC .................................. 327/147–149, 156–158
See application file for complete search history.

(56) References Cited

U.S. PATENT DOCUMENTS

| | | | | |
|---|---|---|---|---|
| 7,368,961 B2* | 5/2008 | Werner | ..................... | G06F 1/04 327/156 |
| 7,375,565 B2* | 5/2008 | Kwak | .................. | G11C 7/1072 327/158 |
| 7,952,438 B2* | 5/2011 | Song | ......................... | H03L 7/18 331/51 |
| 7,965,144 B2* | 6/2011 | Miura | ..................... | H03L 7/183 331/44 |
| 9,998,129 B1* | 6/2018 | Zhuang | ................. | H03L 7/0992 |
| 10,044,359 B1* | 8/2018 | Kim | ......................... | H03L 7/093 |
| 10,476,434 B1* | 11/2019 | Pandita | ................ | H03K 3/0322 |
| 10,541,692 B1* | 1/2020 | Zamprogno | .......... | H03L 7/0816 |
| 2003/0048863 A1* | 3/2003 | Saeki | ..................... | H03L 7/081 375/376 |

(Continued)

OTHER PUBLICATIONS

Nicola Da Dalt, "An Analysis of Phase Noise in Realigned VCOs," IEEE Trans. Circuits and Syst. II, Exp. Briefs, vol. 61, No. 3, pp. 143-147, Mar. 2014.

(Continued)

*Primary Examiner* — Adam D Houston
(74) *Attorney, Agent, or Firm* — Chip Law Group

(57) ABSTRACT

Disclosed here is a PLL circuit that is an injection-locked PLL circuit. The PLL circuit includes a variable frequency oscillator configured in such a manner that a ring oscillator is formed during a period in which a window signal is negated and an injection edge based on a reference clock is allowed to be injected during a period in which the window signal is asserted, a feedback circuit that controls the variable frequency oscillator in such a manner that an oscillation frequency of the variable frequency oscillator gets closer to a target frequency according to the reference clock, and a window generator that receives an internal clock of the variable frequency oscillator and cuts out one pulse to generate the window signal.

15 Claims, 12 Drawing Sheets

(56) References Cited

U.S. PATENT DOCUMENTS

| | | | | |
|---|---|---|---|---|
| 2004/0017261 A1* | 1/2004 | Soumyanath | ............. | H03L 7/18 |
| | | | | 331/100 |
| 2004/0085103 A1* | 5/2004 | Ahn | ...................... | H03L 7/1978 |
| | | | | 327/156 |
| 2006/0001463 A1* | 1/2006 | Lee | ...................... | H03K 5/1565 |
| | | | | 327/147 |
| 2006/0132205 A1* | 6/2006 | Wu | ...................... | H03L 7/0891 |
| | | | | 327/158 |
| 2006/0141963 A1* | 6/2006 | Maxim | ................. | H03L 7/0891 |
| | | | | 455/192.1 |
| 2007/0132515 A1* | 6/2007 | Lee | ......................... | H03L 7/093 |
| | | | | 331/1 A |
| 2007/0153129 A1* | 7/2007 | Kawamoto | ............. | H03L 7/183 |
| | | | | 348/705 |
| 2007/0247248 A1* | 10/2007 | Kobayashi | ............ | H03L 7/1976 |
| | | | | 331/167 |
| 2012/0062293 A1* | 3/2012 | Liang | ........................ | H03L 7/23 |
| | | | | 327/157 |
| 2014/0021987 A1* | 1/2014 | Okada | ..................... | H03L 7/083 |
| | | | | 327/156 |
| 2019/0052280 A1* | 2/2019 | Perez | ..................... | H03L 7/0816 |
| 2019/0058480 A1* | 2/2019 | Kuan | ......................... | H03L 7/24 |
| 2020/0076439 A1* | 3/2020 | Weeks | .................. | H03L 7/0992 |
| 2020/0395944 A1* | 12/2020 | Tsuji | .......................... | H03L 7/07 |

OTHER PUBLICATIONS

Chingyei Chung, Shou-Yen Chao, M. F. Lu, "Nonlinear Feedback System for an Inverter-Based Ring Oscillator," WSEAS Transactions on Circuits and Systems, pp. 537-547, Issue 7, vol. 8, Jul. 2009.

H. Ngo, et al., "A 0.42ps-Jitter −241.7dB-FOM Synthesizable Injection-Locked PLL with Noise-Isolation LDO," ISSCC, pp. 150-151, 2017.

B. Helal et al. "A Highly Digital MDLL-Based Clock Multiplier That Leverages a Self-Scrambling Time-to-Digital Converter to Achieve Subpicosecond Jitter Performance" IEEE Journal of Solid-State Circuits, vol. 43, No. 4, pp. 855-863, Apr. 2008.

* cited by examiner

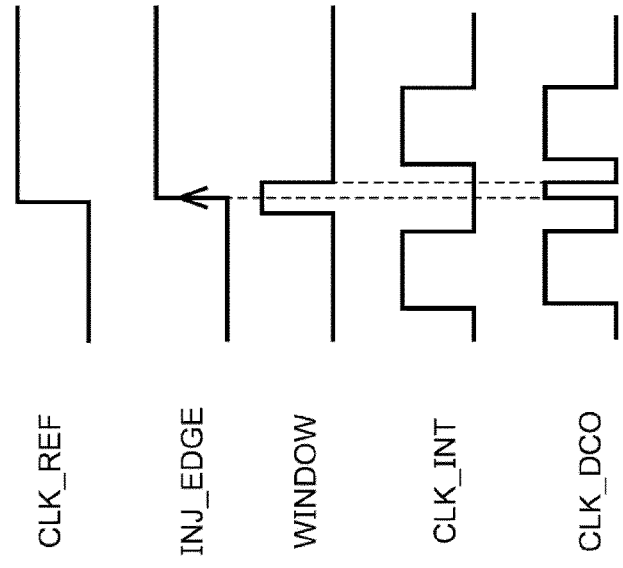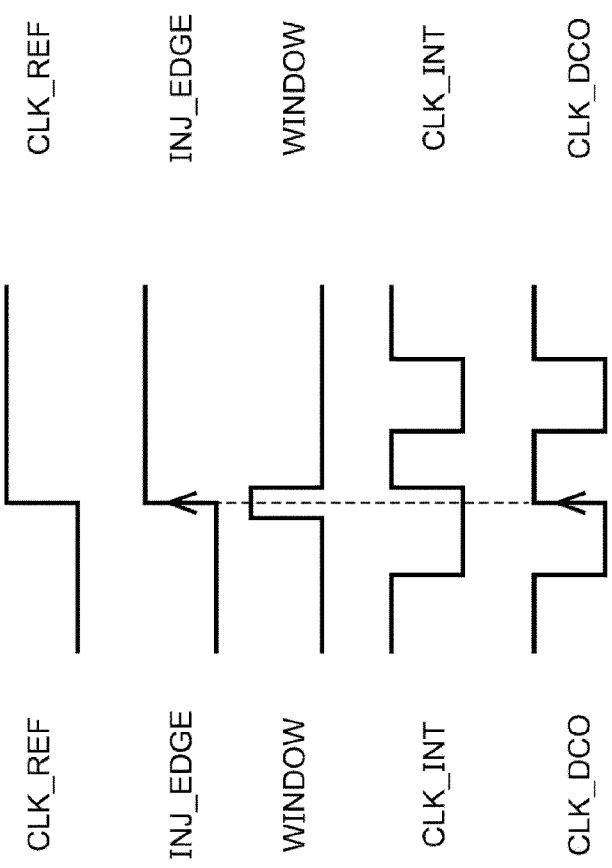

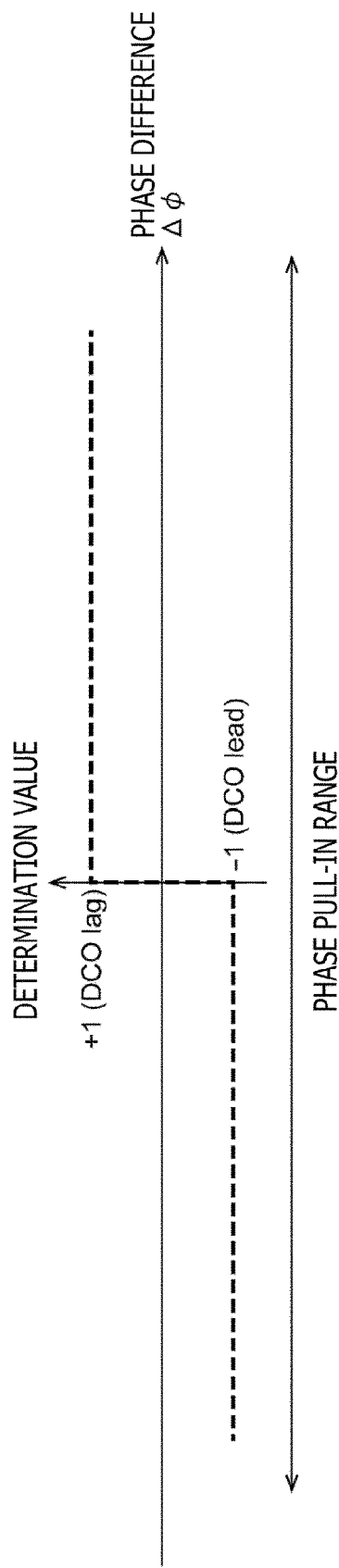
F I G. 9 A
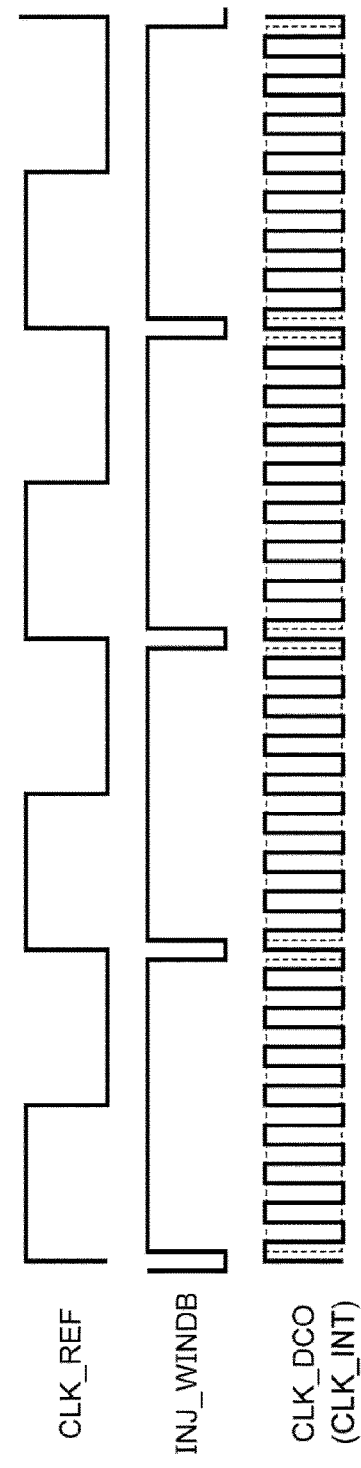
F I G. 9 B

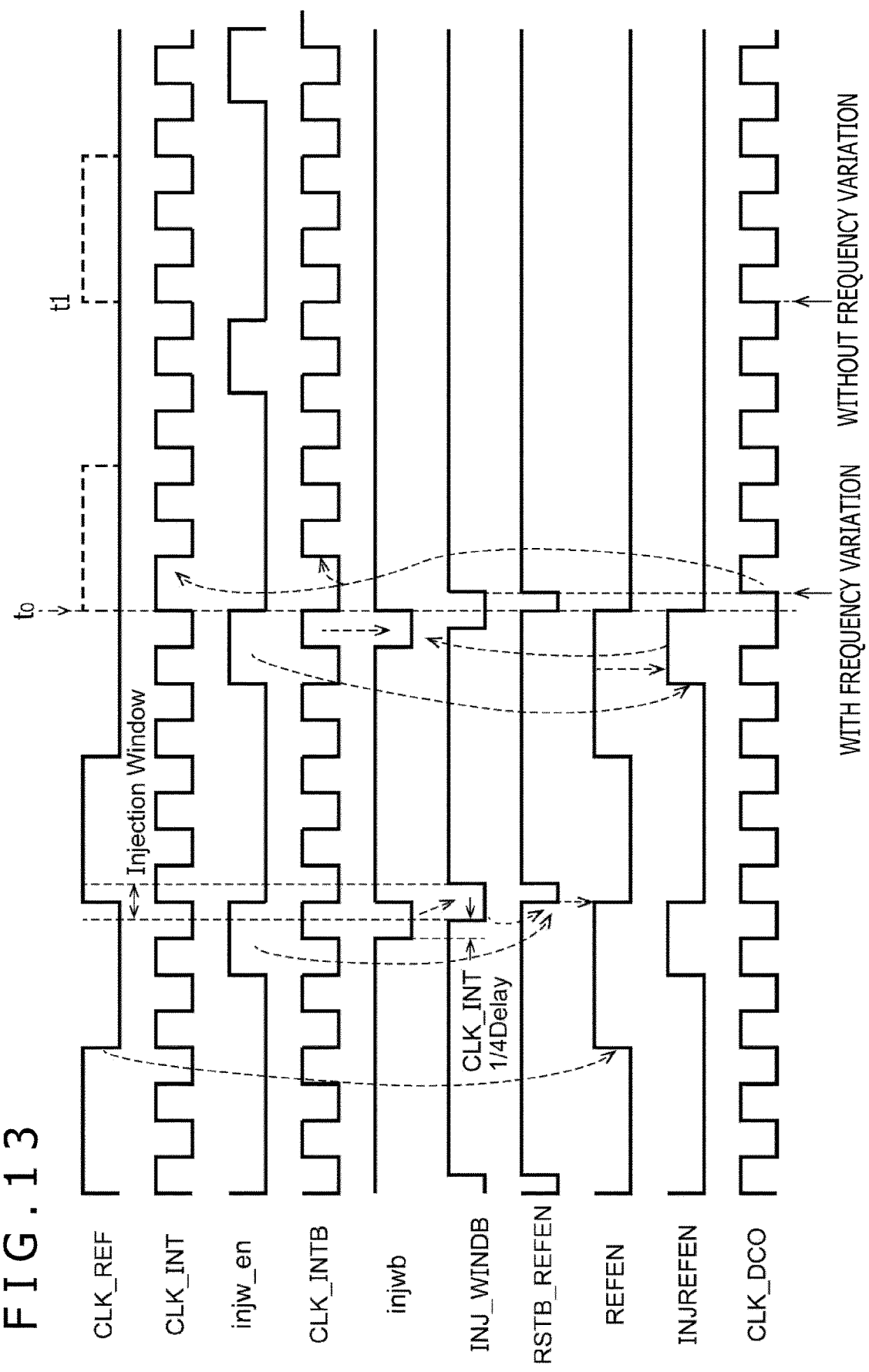

PHASE LOCKED LOOP CIRCUIT

CROSS REFERENCE TO RELATED APPLICATIONS

This application claims priority benefit of Japanese Patent Application No. JP 2019-213528 filed in the Japan Patent Office on Nov. 26, 2019. Each of the above-referenced applications is hereby incorporated herein by reference in its entirety.

BACKGROUND

The present disclosure relates to a phase locked loop (PLL) circuit.

A frequency synthesizer that generates a clock with any frequency from a reference clock is used for various integrated circuits (ICs). A PLL circuit is widely used as such a frequency synthesizer. FIGS. 1A to 1C are block diagrams for explaining basic architecture of the PLL circuit.

An analog PLL circuit 1 is illustrated in FIG. 1A. The analog PLL circuit 1 includes a phase detector (phase frequency detector (PFD)) 10, a charge pump circuit 12, a low-pass filter 14, a voltage controlled oscillator (VCO) 16, and a frequency divider 18. The VCO 16 oscillates at a frequency according to an analog control voltage $V_{CTRL}$. An output clock CLK_VCO of the VCO 16 is subjected to 1/N frequency division by the frequency divider 18. The phase detector 10 detects the phase difference between a clock CLK_DIV after the frequency division and a reference clock CLK_REF and controls the charge pump circuit 12. The low-pass filter 14 is a loop filter that smooths the output voltage of the charge pump circuit 12 and generates the control voltage $V_{CTRL}$.

The analog PLL circuit 1 of FIG. 1A has been used for various applications from old times and has high reliability. However, there is a problem that the chip size becomes large due to the loop filter. Further, to exert sufficient performance, the circuit designer may need to optimize the layout of the circuit.

In FIG. 1B, an all digital PLL (ADPLL) circuit 2 is illustrated. The ADPLL circuit 2 receives a frequency control word (FCW) and the reference clock CLK_REF and generates an output clock CLK_DCO obtained by multiplying the reference clock CLK_REF according to the FCW. The ADPLL circuit 2 includes a frequency phase detector 20, a digital filter 22, and a digital controlled oscillator (DCO) 24. The DCO 24 oscillates at a frequency according to an input control code $D_{CTRL}$. The frequency phase detector 20 has functions corresponding to the phase detector 10, the charge pump circuit 12, and the frequency divider 18 in FIG. 1A and includes a time-to-digital converter (TDC), an adder, and a counter. A digital signal generated by the frequency phase detector 20 is subjected to filtering by the digital filter 22 and is input to the DCO 24.

The ADPLL circuit 2 of FIG. 1B can be configured with a digital circuit that is easily designed by a miniaturized semiconductor process and therefore has an advantage that the chip area can be set small. On the other hand, although the ADPLL circuit 2 includes the term "all digital," the circuit designer may need to manually optimize the layout of the circuit to satisfy the desired specifications regarding the frequency phase detector 20 and the DCO 24.

In FIG. 1C, an injection-locked PLL (IL-PLL) circuit 3 is illustrated. The IL-PLL circuit 3 can be designed with architecture of an analog circuit or digital circuit. Here, the case in which it is configured with a digital circuit will be described. The IL-PLL circuit 3 includes a feedback circuit 30, a DCO 32, and an edge injection circuit 34. The IL-PLL circuit 3 is grasped as a hybrid of feedback control and feedforward control and stabilizes the oscillation frequency of the DCO 32 by feedback control by the feedback circuit 30 corresponding to the frequency phase detector 20 and the digital filter 22 in FIG. 1B. The edge injection circuit 34 cuts out an edge of the reference clock CLK_REF and injects the cut-out edge to the DCO 32 to carry out realignment of the phase of the output clock CLK_DCO. The IL-PLL circuit is also referred to as a multiplying delay locked loop (MDLL) circuit according to the method of injection of the edge in some cases.

The IL-PLL circuit has an advantage (i) that the loop band is widened due to the injection locking, and therefore, reduction in phase noise (reduction in jitter) is possible. Further, when being configured with a digital circuit, the IL-PLL circuit has an advantage (ii) that reduction in noise is possible because the phase detector 10 and the charge pump circuit 12 in FIG. 1A do not exist. In addition, the IL-PLL circuit has the following characteristic (iii). The IL-PLL circuit is less susceptible to the influence of noise due to the feedback path, and thus, it can be said that the flexibility of the layout is high. Therefore, desired characteristics are obtained even through automatic placement and routing by use of a design support tool such as a place-and-route (P & R) tool.

An example of the related art is disclosed in Nicola Da Dalt, "An Analysis of Phase Noise in Realigned VCOs," IEEE Trans. Circuits and Syst. II, Exp. Briefs, vol. 61, no. 3, pp. 143-147, March 2014.

Another example of the related art is disclosed in Chingyei Chung, Shou-Yen Chao, M. F. Lu, "Nonlinear Feedback System for an Inverter-Based Ring Oscillator," WSEAS TRANSACTIONS on CIRCUITS and SYSTEMS, pp. 537-547, Issue 7, Volume 8, July 2009.

SUMMARY

The present inventor has reached recognition of the following problems as the result of making studies on the IL-PLL circuit. FIG. 2 is a circuit diagram of the IL-PLL circuit on which the present inventor has made studies. The DCO 32 includes a variable delay circuit 40, an inverter 41, and a multiplexer 42.

The variable delay circuit 40 gives a variable delay $\tau_D$ according to a control code from the feedback circuit 30 to the output clock CLK_DCO. The inverter 41 logically inverts the delayed clock. To the multiplexer 42, an injection edge (INJ_EDGE) signal from the edge injection circuit 34 is input in addition to an output CLK_INT of the inverter 41. The multiplexer 42 selects one of them. During the period in which the multiplexer 42 selects the clock CLK_INT, a ring oscillator is formed by the variable delay circuit 40, the inverter 41, and the multiplexer 42, and the DCO 32 oscillates at a frequency (cycle) according to a delay T set on the basis of the control code.

The edge injection circuit 34 generates an INJ_EDGE signal and a window signal WINDOW on the basis of the reference clock CLK_REF. The window signal WINDOW is a narrow-pulse signal that becomes a predetermined level (for example, high) for a period including the timing of the INJ_EDGE signal.

The edge injection circuit 34 includes two delay circuits 44 and 46 and a flip-flop 48. The delay circuit 44 delays the reference clock CLK_REF to generate the INJ_EDGE signal. The flip-flop 48 and the delay circuit 46 generate the window signal WINDOW. Specifically, the reference clock CLK_REF is input to the clock terminal of the flip-flop 48, and an INJ_EDGE' signal further delayed by the delay circuit 46 is input to the reset terminal.

FIGS. 3A and 3B are operation waveform diagrams of the IL-PLL circuit 3 of FIG. 2. FIG. 3A illustrates the state when the INJ_EDGE signal is normally injected.

In FIG. 3B, operation when the window signal WINDOW with a narrow pulse width is used is illustrated. Part of the injection edge INJ_EDGE is cut out by the rear edge of the window signal WINDOW, and this is superimposed on the internal clock CLK_INT, so that a glitch occurs in the output clock CLK_DCO. Such a glitch becomes a cause that brings malfunction on the system and is not preferable. Further, due to this glitch, the frequency of the output clock CLK_DCO instantaneously becomes high. When the DCO 32 and the feedback circuit 30 are locked to a harmonic in this state, there is a possibility that the DCO 32 falls into the state in which the DCO 32 oscillates at an unintended frequency (harmonic oscillation). In the first place, when the error in the phase becomes large before the phase is locked at the time of activation or due to some disturbance, the operation mode of FIG. 3B is caused, which is a problem.

To prevent such abnormal operation, the width of the window may need to be correctly designed on the basis of the oscillation frequency of the DCO 32. However, the amount of delay of the delay circuits 44 and 46 is affected by process, voltage, and temperature (PVT) variations, and therefore, the window width is also affected by the PVT variations. Therefore, the window width may need to be designed on the basis of the worst case in consideration of the PVT variations.

Further, a dynamic voltage and frequency scaling (DVFS) technique in which the supply voltage and the clock frequency are dynamically controlled for reduction in the power consumption of large scale integration (LSI) is known. However, it is difficult to implement the IL-PLL circuit 3 of FIG. 2 on an application that employs the DVFS.

Even in the case in which the IL-PLL circuit 3 is used for an application in which the variation range of the operating frequency is small (or the frequency is fixed), malfunction of the IL-PLL circuit 3 is caused when large phase variation occurs in the reference clock CLK_REF or the clock CLK_INT or CLK_DCO due to disturbance such as voltage variation or electromagnetic wave noise.

Further, in an MDLL circuit described in "A Highly Digital MDLL-Based Clock Multiplier That Leverages a Self-Scrambling Time-to-Digital Converter to Achieve Sub-picosecond Jitter Performance" IEEE JOURNAL OF SOLID-STATE CIRCUITS, VOL. 43, NO. 4, pp. 855-863, April 2008, oscillation stops when the reference clock is not input. In the case in which the clock is supplied to a system and is used as a system clock, the whole system stops, which causes a significant program.

As above, although having many advantages, the IL-PLL circuit and the MDLL circuit have a large bottleneck for employment for an application in which high reliability is required.

The present disclosure is made in view of such problems, and it is desirable to provide an IL-PLL circuit that can solve at least one of the above-described problems.

A mode of the present disclosure relates to an injection-locked PLL circuit. The PLL circuit includes a variable frequency oscillator configured in such a manner that a ring oscillator is formed during a period in which a window signal is negated and an injection edge based on a reference clock is allowed to be injected during a period in which the window signal is asserted, a feedback circuit that controls the variable frequency oscillator in such a manner that the oscillation frequency of the variable frequency oscillator gets closer to a target frequency according to the reference clock, and a window generator that receives an internal clock of the variable frequency oscillator and cuts out one pulse to generate the window signal.

What are obtained by combining the above constituent elements as desired or what are obtained by translating expressions of the present disclosure among methods, devices, and so forth are also effects as modes of the present disclosure.

According to the mode of the present disclosure, at least one of the above-described problems can be solved.

BRIEF DESCRIPTION OF THE DRAWINGS

FIGS. 3A and 3B are operation waveform diagrams of the IL-PLL circuit of FIG. 2;

FIGS. 9A and 9B are diagrams for explaining operation of the feedback circuit of FIG. 8;

FIG. 13 is an operation waveform diagram of the PLL circuit of FIG. 12.

DETAILED DESCRIPTION OF THE PREFERRED EMBODIMENT

Outline of Embodiment

Figure 1A:
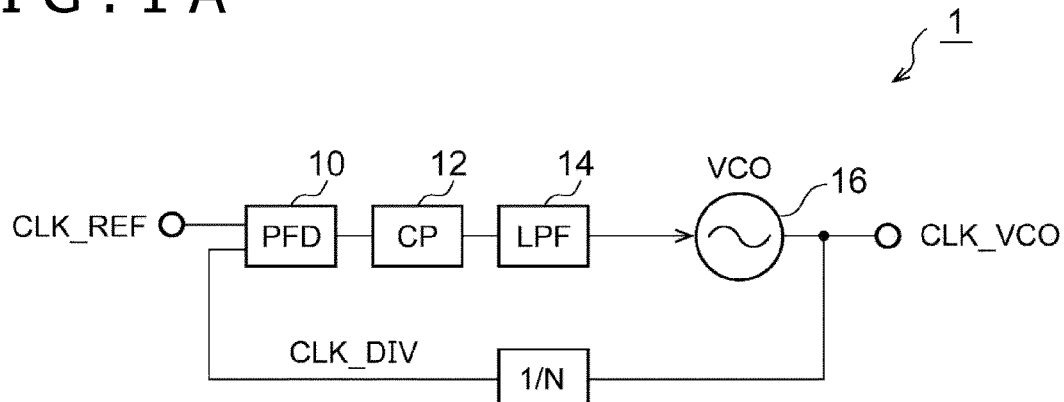
FIGS. 1A to 1C are block diagrams for explaining basic architecture of a PLL circuit.
Figure 1B:
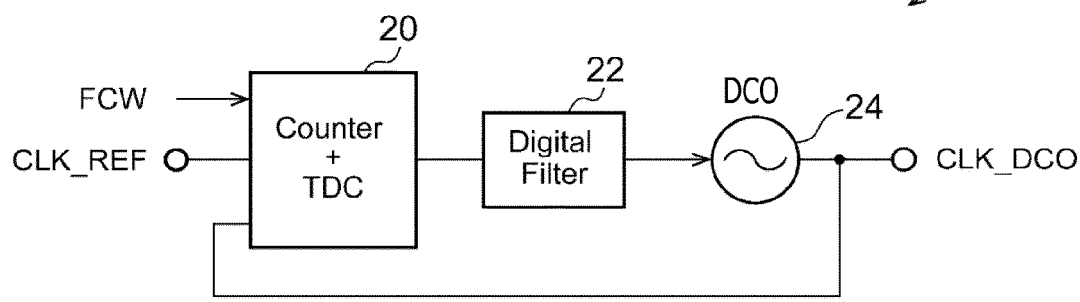
Figure 1C:
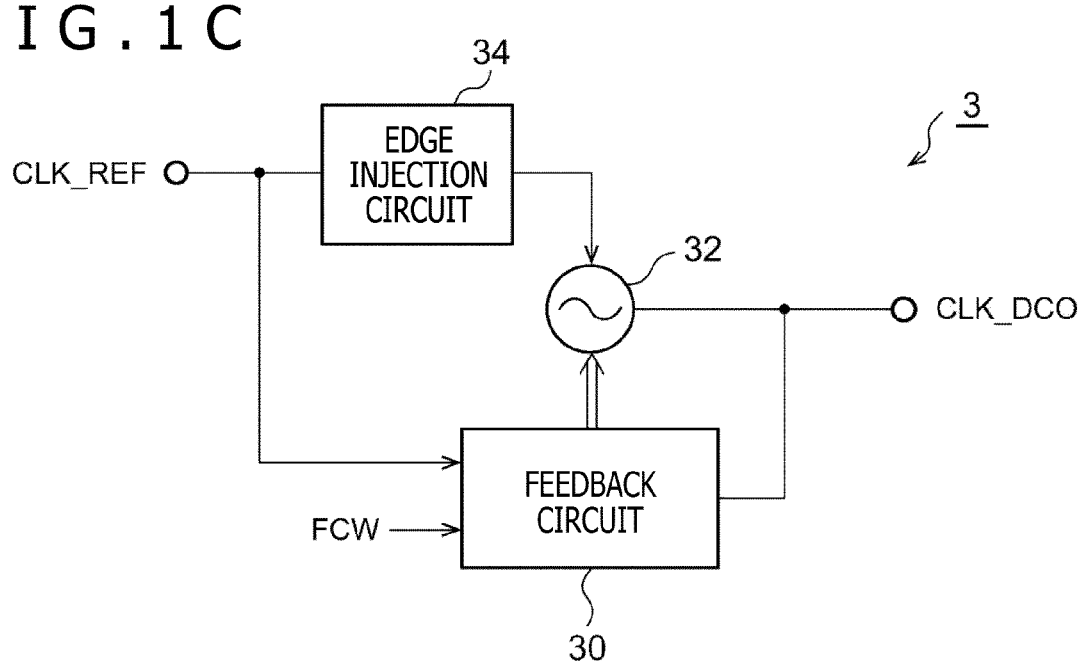
Figure 2:
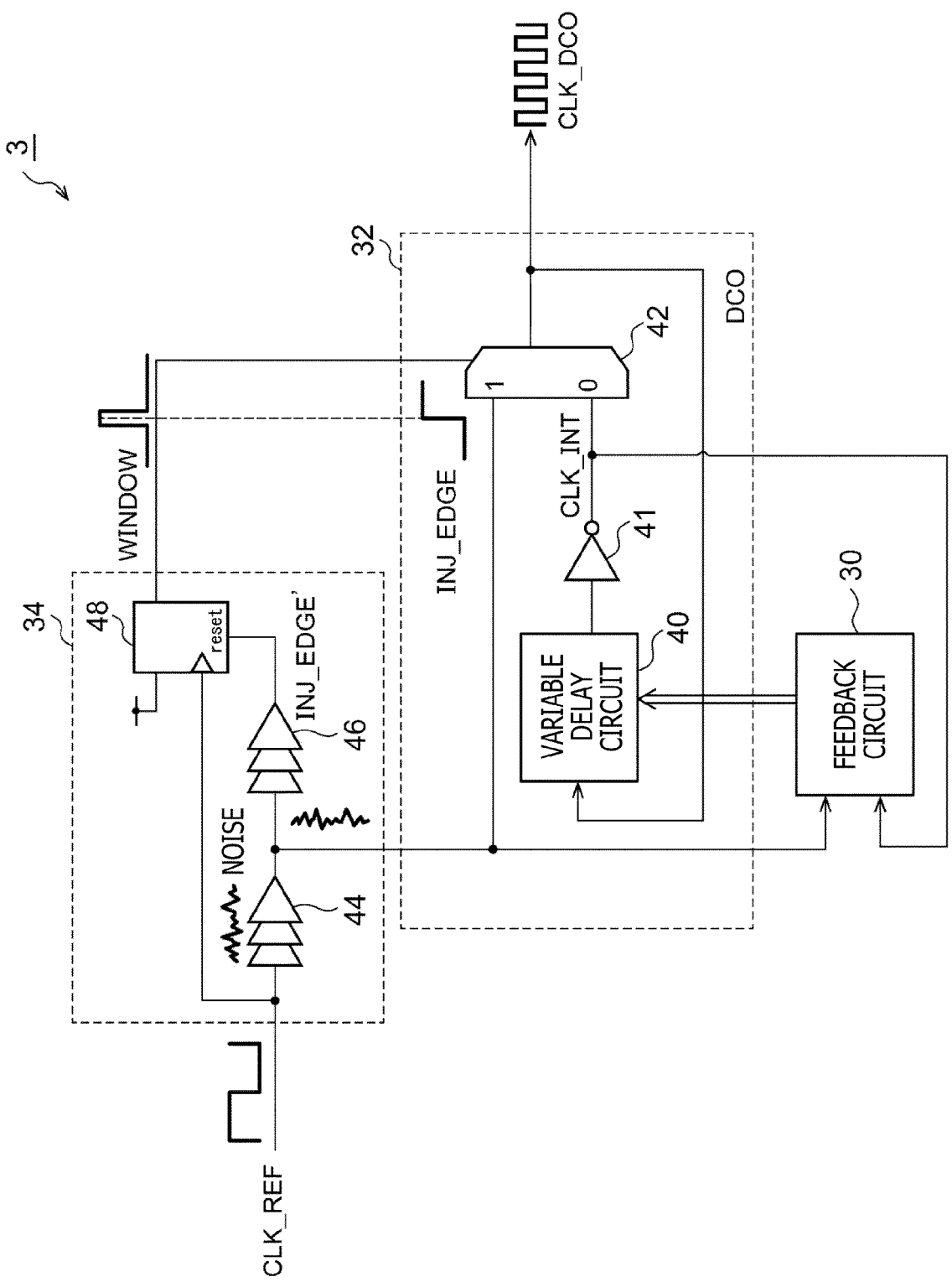
FIG. 2 is a circuit diagram of an IL-PLL circuit on which the present inventor has made studies.

One embodiment disclosed in the present specification relates to an injection-locked PLL circuit. The PLL circuit includes a variable frequency oscillator configured in such a manner that a ring oscillator is formed during a period in which a window signal is negated and an injection edge based on a reference clock is allowed to be injected during a period in which the window signal is asserted, a feedback circuit that controls the variable frequency oscillator in such a manner that the oscillation frequency of the variable frequency oscillator gets closer to a target frequency according to the reference clock, and a window generator that receives an internal clock of the variable frequency oscillator and cuts out one pulse to generate the window signal.

The timing when the window defined by the window signal opens (assert) and the timing when the window closes (negate) do not depend on the reference clock. Therefore, the window can be surely opened and closed irrespective of whether or not the reference clock is present while the variable frequency oscillator is oscillating. Further, timing adjustment can be carried out in such a manner that the injection edge of the reference clock is surely included in a period in which the window is open. Therefore, glitch and harmonic oscillation that derive from the window signal do not occur. If transition (edge) of the reference clock does not occur in the period in which the window is open, the cycle of the internal clock becomes longer at a ratio of one time per a predetermined cycle (multiplication factor). However, the oscillation does not stop. As above, according to the embodiment, several of existing problems can be solved.

The window generator may generate a pulse signal asserted during the half cycle of the internal clock, one time per N cycles (N≥2) of the internal clock, and delay the pulse signal by a period of time that is M times (0<M<1) the cycle of the internal clock to generate the window signal. This can adjust the timing of the window signal in such a manner that the injection edge exists in the assertion period of the window signal.

M=¼ may be set. This can adjust the timing of the window signal in such a manner that the injection edge exists at subsequently the center of the assertion period of the window signal. M does not need to be exactly ¼.

The window generator may include a counter that counts the internal clock and asserts an output during one cycle per N cycles, a logic gate that carries out logical operation of the output of the counter and the internal clock to generate the pulse signal, and a delay line that delays the pulse signal by the amount of delay that is ¼ of the cycle of the internal clock.

The variable frequency oscillator may include a variable delay circuit. The delay line may be a replica with the same circuit format as the variable delay circuit.

The delay line may give a delay that is half of a delay of the variable delay circuit. In the ring oscillator, the amount of delay of the variable delay circuit corresponds to substantially the half cycle of the internal clock. Therefore, the delay that is half of the delay of the variable delay circuit is the ¼ cycle of the internal clock.

The variable frequency oscillator may include a variable delay circuit and a multiplexer that receives the internal clock as an output of the variable delay circuit at one input and receives the injection edge at the other input. The multiplexer has an output connected to an input of the variable delay circuit and selects one of the internal clock and the injection edge according to the window signal.

The window generator may include a replica of the multiplexer through which the window signal passes. This can reduce the influence of timing deviation attributed to the multiplexer.

The multiplexer may include a first NAND gate that receives the internal clock at a first input and receives the window signal at a second input, a second NAND gate that receives the reference clock at a first input and receives the inverted window signal at a second input, a third NAND gate that receives an output of the first NAND gate at a first input and receives an output of the second NAND gate at a second input, and a fourth NAND gate that receives the output of the first NAND gate at a first input and receives the output of the second NAND gate at a second input. The fourth NAND gate has an output connected to an output of the third NAND gate. The general multiplexer includes a pair of two NAND gates at the first stage and one NAND gate at the subsequent stage. In the NAND gate, a delay difference between two input signals that derives from asymmetry of the configuration thereof exists. Therefore, in the general multiplexer, a delay difference arises between the two input signals of the multiplexer in the NAND gate at the output stage. Thus, a pair of two NAND gates are disposed as this NAND gate at the output stage and are connected with the respective inputs interchanged. This can cancel out the delay difference between the two input signals.

The variable delay circuit may include a first delay circuit that gives a coarse amount of delay control and a second delay circuit that gives a sufficiently-short amount of delay control that can satisfy, in full scale, an amount of delay corresponding to 1 LSB of the amount of control of the first delay circuit. The delay line may include a replica of the first delay circuit, and the replica may be given a second control code having values of ½ of values of a first control code given to the first delay circuit. In this case, in the amount of delay of the variable delay circuit, the delay by the first delay circuit is dominant. Therefore, by using the replica of the part, the delay of the ¼ cycle of the internal clock can be generated.

The reference clock may be directly injected as the injection edge. Due to this, the reference clock does not pass through a delay circuit or a logic gate, and therefore, phase noise brought on the injection edge by power supply noise can be reduced.

The feedback circuit may include a symmetric phase detector that becomes an enabled state to compare the phases of the reference clock and a clock signal generated by the variable frequency oscillator and generate an up-down signal that indicates a comparison result, during a period in which the window signal is asserted, and a digital filter that generates a control code according to the up-down signal. By enabling the symmetric phase detector only during the period in which the window signal is asserted, the phase pull-in range can be widened to the range of one cycle of the reference clock.

The feedback circuit may include a phase frequency detector that becomes an enabled state to compare the phases and the frequencies of the reference clock and a clock signal generated by the variable frequency oscillator and generate an up-pulse and a down-pulse that indicate a comparison result, during a period in which the window signal is asserted, and a digital filter that generates a control code according to an up-down signal based on the up-pulse and the down-pulse. The phase pull-in range can be widened substantially infinitely by employing the phase frequency detector that has an originally-wide phase pull-in range and has a frequency pull-in function and enabling the phase frequency detector only during the period in which the window signal is asserted.

When the injection edge is not generated although the window opens, the frequency of the variable frequency oscillator varies in the short term every cycle of the reference clock. Thus, the window generator may keep the window signal negated when it is difficult to detect an edge of the reference clock. This can also continue clock generation by the PLL circuit when the reference clock has stopped. Further, the frequency of the variable frequency oscillator varies only immediately after the reference clock is lost but can be kept constant after that.

The PLL circuit may further include a clock monitoring circuit that generates a clock enable signal that is asserted when the reference clock is normally input and is negated when the reference clock stops. The output of the counter may be masked according to the clock enable signal.

EMBODIMENT

The present disclosure will be described below on the basis of the preferred embodiment with reference to drawings. The same or equivalent constituent element, component, and processing illustrated in the respective drawings are given the same reference sign, and overlapping description is omitted as appropriate. Further, the embodiment is not what limits the disclosure but exemplification, and all characteristics described in the embodiment and combinations thereof are not necessarily essential matters of the disclosure.

In the present specification, "the state in which a component A is connected to a component B" includes, besides the case in which the component A and the component B are directly connected physically, the case in which the component A and the component B are indirectly connected with the intermediary of another component that does not have a substantial influence on the electrical connection state of them or does not impair functions and effects provided due to the coupling of them.

Similarly, "the state in which a component C is disposed between a component A and a component B" includes, besides the case in which the component A and the component C or the component B and the component C are directly connected, the case in which the component A and the component C or the component B and the component C are indirectly connected with the intermediary of another component that does not have a substantial influence on the electrical connection state of them or does not impair functions and effects provided due to the coupling of them.

Figure 4:
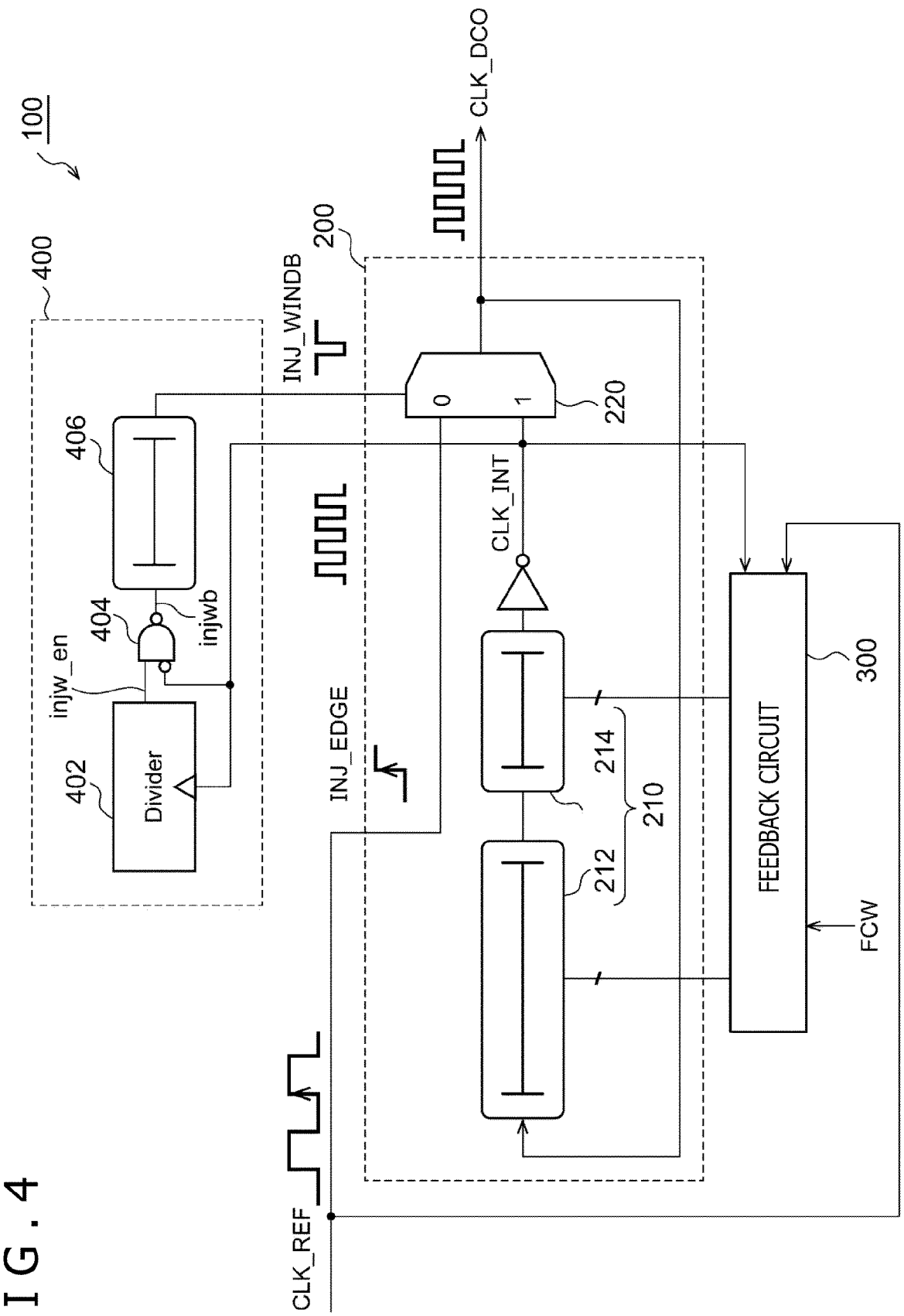
FIG. 4 is a block diagram of a PLL circuit according to an embodiment.

FIG. 4 is a block diagram of a PLL circuit 100 according to the embodiment. The PLL circuit 100 is based on an injection-locked system and includes a variable frequency oscillator 200, a feedback circuit 300, and a window generator 400.

The variable frequency oscillator 200 is configured in such a manner that a ring oscillator is formed during the period in which a window signal INJ_WINDB is negated (high because the present embodiment is based on a negative logic system) and that an injection edge INJ_EDGE based on a reference clock CLK_REF can be injected during the period in which the window signal INJ_WINDB is asserted (low).

Preferably, the reference clock CLK_REF is directly injected as the injection edge INJ_EDGE. Due to this, the reference clock CLK_REF does not pass through a delay circuit or a logic gate, and therefore, phase noise brought on the injection edge by power supply noise can be reduced.

The variable frequency oscillator 200 is an oscillator that can be digitally controlled (digital controlled oscillator (DCO)) and includes a variable delay circuit 210 and a multiplexer 220. The variable delay circuit 210 generates a delay according to a given control code. The variable delay circuit 210 can be configured as a series connection of a first delay circuit 212 and a second delay circuit 214. The first delay circuit 212 gives a delay of a relatively-coarse resolution, and the second delay circuit 214 gives a delay of a relatively-high resolution. The output of the variable delay circuit 210 is led out to the external of the variable frequency oscillator 200, as an internal clock CLK_INT. The variable frequency oscillator 200, which is a ring oscillator, includes an inverter for logical inversion. The insertion position of the inverter is not limited. The inverter may be disposed on the input side or the output side of the variable delay circuit or may be incorporated in the variable delay circuit or the multiplexer. In the following description, the inverter will not be clearly described.

The multiplexer 220 receives the internal clock CLK_INT at one input (1), receives the injection edge INJ_EDGE at the other input (0), and selects one of them according to the window signal INJ_WINDB. Specifically, the multiplexer 220 selects the injection edge INJ_EDGE when the window signal INJ_WINDB is asserted (low=0 because a negative logic system is employed in the present embodiment), and selects the internal clock CLK_INT when the window signal INJ_WINDB is negated (high=1). The output of the multiplexer 220 is returned to the input of the variable delay circuit 210.

The feedback circuit 300 carries out feedback control of the control code given to the variable delay circuit 210 in such a manner that an oscillation frequency $f_{DCO}$ of the variable frequency oscillator 200 gets closer to a target frequency based on a frequency $f_{REF}$ of the reference clock CLK_REF. For example, a frequency control word (FCW) that defines a target frequency $f_{TGT}$ is input to the feedback circuit 300, and the frequency $f_{DCO}$ of the internal clock CLK_INT (i.e., output clock CLK_DCO) is stabilized, with $f_{REF} \times FCW$ being the target frequency.

The configuration and the control system of the feedback circuit 300 are not particularly limited. Either a frequency locked loop (FLL) system or a PLL system can be used, or they can be used in combination. For example, the amount of delay of the first delay circuit 212 may be controlled by the FLL system, and the amount of delay of the second delay circuit 214 may be controlled by the PLL system. Alternatively, the amount of delay of both the first delay circuit 212 and the second delay circuit 214 may be controlled by the PLL system.

The window generator 400 receives the internal clock CLK_INT and generates the window signal INJ_WINDB by cutting out one pulse. That is, in the present embodiment, the window signal INJ_WINDB is generated independently of the reference clock CLK_REF.

Figure 5:
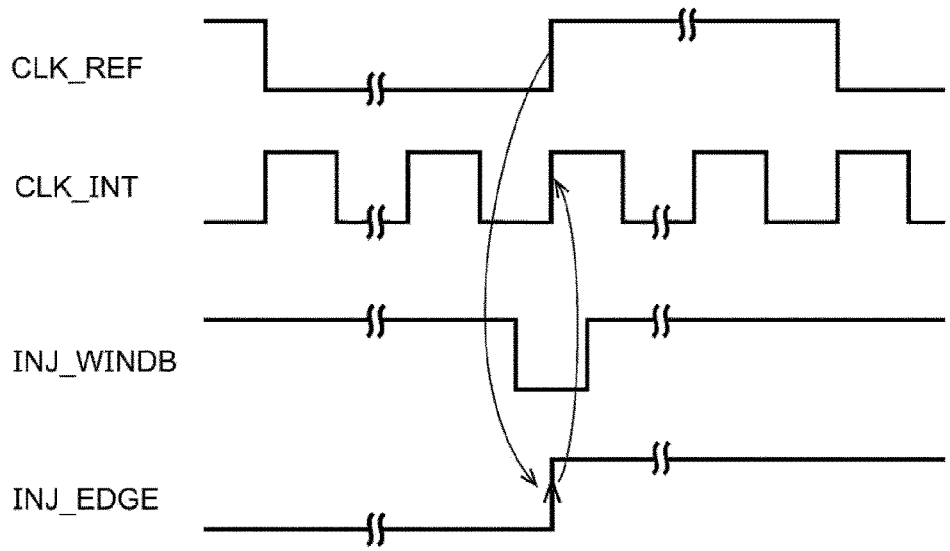
FIG. 5 is an operation waveform diagram of the PLL circuit of FIG. 4.

The above is the basic configuration of the PLL circuit 100. Subsequently, operation thereof will be described. FIG. 5 is an operation waveform diagram of the PLL circuit 100 of FIG. 4. The internal clock CLK_INT and the output clock CLK_DCO generated by the variable frequency oscillator 200 are signals obtained by multiplying the reference clock CLK_REF by N. The window signal INJ_WINDB is generated by cutting out a pulse of the internal clock CLK_INT (half cycle) and properly adjusting the timing. Therefore, the window signal INJ_WINDB can include an edge of the reference clock CLK_REF in its assertion period (low section). This injection edge INJ_EDGE is injected to the variable frequency oscillator 200, and the internal clock CLK_INT (and output clock CLK_DCO) generated by the variable frequency oscillator 200 is subjected to retiming by the injection edge INJ_EDGE.

The above is the operation of the PLL circuit 100. According to the PLL circuit 100, the timing when the window defined by the window signal INJ_WINDB opens (assert) and the timing when the window closes (negate) do not depend on the reference clock CLK_REF. Therefore, the window can be surely opened and closed irrespective of whether or not the reference clock CLK_REF is present while the variable frequency oscillator 200 is oscillating.

Further, timing adjustment can be carried out in such a manner that the injection edge INJ_EDGE of the reference clock CLK_REF is surely included in a period in which the window is open. Therefore, the glitch and harmonic oscillation can be suppressed. If transition (edge) of the reference clock does not occur in the period in which the window is open, the cycle of the internal clock CLK_INT (and output clock CLK_DCO) becomes longer at a ratio of one time per a predetermined cycle (multiplication factor N). However, the oscillation does not stop. As above, according to the PLL circuit 100 of FIG. 4, several of existing problems can be solved.

Referring back to FIG. 4, the window generator 400 generates a pulse signal injwb asserted during the half cycle of the internal clock CLK_INT (i.e., high section or low section of the internal clock) one time per N cycles (N≥2) of the internal clock CLK_INT. Then, the window generator 400 delays the pulse signal injwb by a period of time that is M times (0<M<1) the cycle of the internal clock CLK_INT to generate the window signal INJ_WINDB. The multiplication factor of the PLL circuit 100 is preferable as N.

When M=¼ is set, the timing of the window signal INJ_WINDB can be adjusted in such a manner that the injection edge INJ_EDGE exists at the center of the assertion period (low) of the window signal INJ_WINDB.

The window generator 400 includes a counter 402, a logic gate 404, and a delay line 406. The counter 402 counts the internal clock CLK_INT and asserts its output injw_en during one cycle per N cycles. The logic gate 404 carries out logical operation of the output injw_en of the counter 402 and the internal clock CLK_INT to generate the pulse signal injwb. For example, the logic gate 404 may include a NAND gate that generates the NAND of the inverted signal of the internal clock CLK_INT and the output injw_en of the counter 402.

Figure 6:
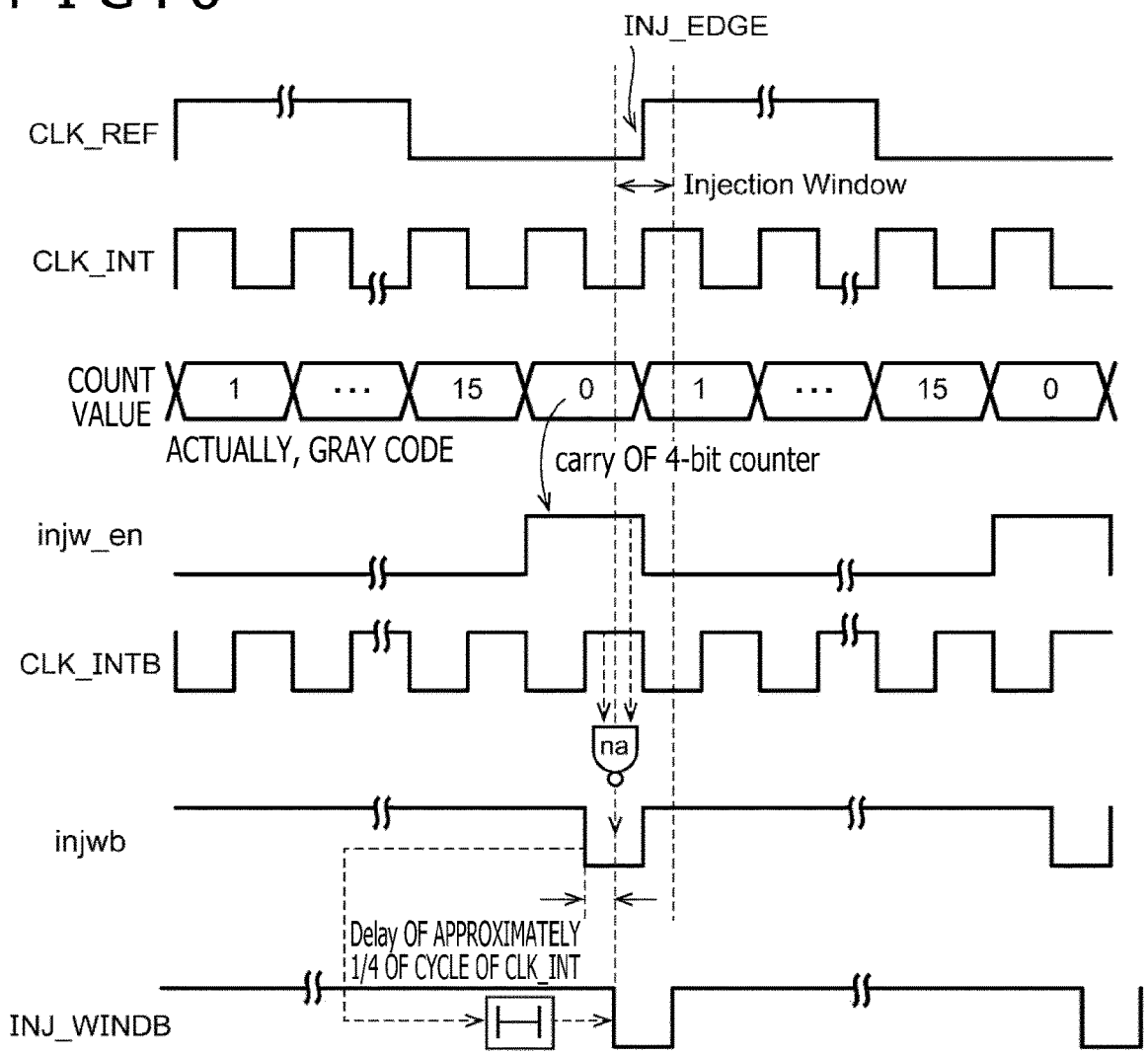
FIG. 6 is an operation waveform diagram of the PLL circuit of FIG. 4.

The above is the basic configuration of the PLL circuit 100. Subsequently, operation thereof will be described. FIG. 6 is an operation waveform diagram of the PLL circuit 100 of FIG. 4. Here, the case of N=16 is illustrated. The counter 402 is configured with 4 bits, and a carry signal is used as injw_en. CLK_INTB is the inverted signal of the internal clock CLK_INT, and the pulse signal injwb is generated through NAND operation of the injw_en signal and the CLK_INTB signal. This pulse signal injwb is given a delay corresponding to approximately ¼ of the cycle of the internal clock CLK_INT (½ of the pulse width of CLK_INT), and therefore, the window signal INJ_WINDB is generated. The positive edge (injection edge) of the reference clock CLK_REF is located at substantially the center of the INJ_WINDB signal. Therefore, even when jitter is superimposed on the reference clock CLK_REF, retiming can be carried out by the injection edge as long as the injection edge falls within the range of the pulse width of the internal clock CLK_INT (¼ cycle of CLK_INT).

Figure 7:
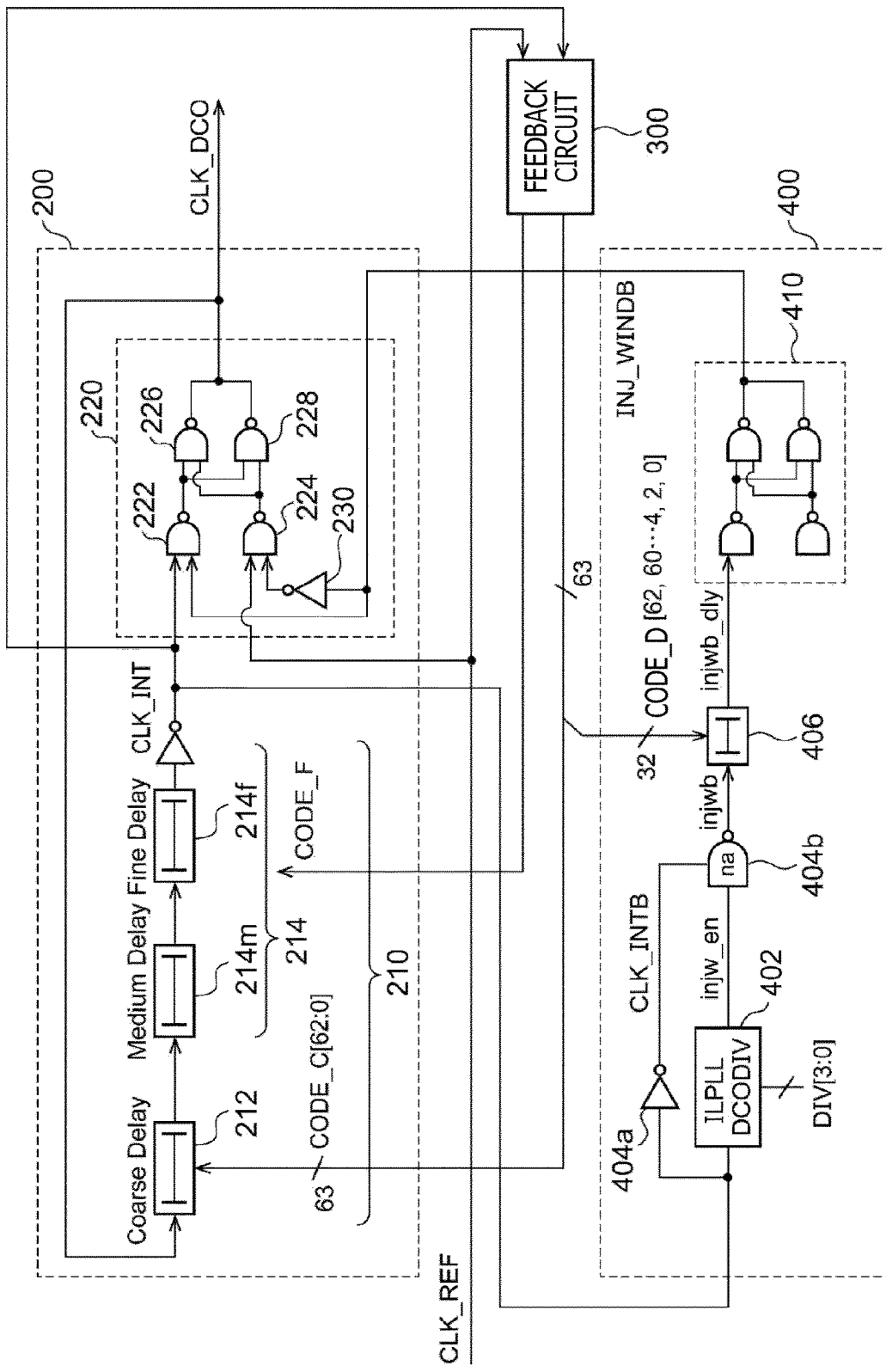
FIG. 7 is a circuit diagram illustrating a specific configuration example of the PLL circuit.

FIG. 7 is a circuit diagram illustrating a specific configuration example of the PLL circuit 100. The variable frequency oscillator 200 will be described. The first delay circuit 212 and the second delay circuit 214 are different in the resolution as described above. The former has a configuration suitable to give a delay of a low resolution, and the latter has a circuit configuration suitable to give a delay of a high resolution. The second delay circuit 214 may include two delay circuits 214m and 214f different in the resolution.

The multiplexer 220 includes a first NAND gate 222 to a fourth NAND gate 228 and an inverter 230. In general, the multiplexer 220 includes a pair of two NAND gates. However, a difference often arises between delays of two input signals due to the influence of element variation. Thus, by symmetrically disposing two pairs, the delay difference between the two input signals can be reduced.

Subsequently, the window generator 400 will be described. The delay given by the delay line 406 is approximately ¼ of the cycle of the internal clock CLK_INT as described above. The delay given by the variable delay circuit 210 in the variable frequency oscillator 200 corresponds to ½ of the cycle of the internal clock CLK_INT (CLK_DCO). Therefore, half of the delay given by the variable delay circuit 210 is the delay that should be given to the injwb signal.

In the delay with the length of the half cycle of the internal clock CLK_INT, the delay by the first delay circuit 212 is dominant. Thus, the delay line 406 is configured to ignore the delay given by the second delay circuit 214 and give a delay that is ½ of the delay of the first delay circuit 212 to the injwb signal.

The control code given to the first delay circuit 212 is a thermometer code CODE_C[62:0] and is configured in such a manner that a delay obtained by multiplying the value of the thermometer code CODE_C[62:0] (the number of bits at which 1 is marked) by the unit delay can be generated. In this example, the thermometer code is 63 bits.

The delay line 406 is a replica having the same circuit format as the first delay circuit 212. The unit delay is designed in the same manner as the first delay circuit 212, and the number of stages is ½ of the number of stages of the first delay circuit 212. Therefore, the number of bits of a thermometer code CODE_D[31:0] given to the delay line 406 is ½ of the number of bits of the thermometer code given to the first delay circuit 212. CODE_D[31:0] can be generated by decimating CODE_C[62:0] every other bit.

In FIG. 7, the logic gate 404 in FIG. 4 is illustrated with decomposition into an inverter 404a and a NAND gate 404b. Further, a dummy multiplexer 410 is disposed in the window generator 400.

The multiplexer 410 is disposed to cancel the influence of the multiplexer 220 in the variable frequency oscillator 200. The multiplexer 410 is a replica of the multiplexer 220 and gives the same delay as the multiplexer 220 to an output injwb_dly of the delay line 406 to cancel the influence of the multiplexer 220.

Subsequently, the configuration of the feedback circuit 300 will be described. The frequency of the output clock CLK_DCO of the variable frequency oscillator 200 is N times the frequency of the reference clock CLK_REF. Therefore, in a general PLL circuit, a configuration is employed in which, similarly to FIG. 1A, the output clock CLK_DCO is subjected to 1/N frequency division by a frequency divider and the phase difference and/or the frequency difference between the feedback clock after the frequency division and the reference clock are/is detected. When a non-negligible delay occurs in the frequency divider, there is a problem that the reference spurious increases due to the delay in the frequency divider, in the injection-locked PLL circuit. Thus, in the present embodiment, in the feedback circuit 300, the frequency divider, which may need to be operated at high speed, is not used, and the phases and/or the frequencies of the output clock CLK_DCO and the reference clock CLK_REF different in the frequency are compared.

Figure 8:
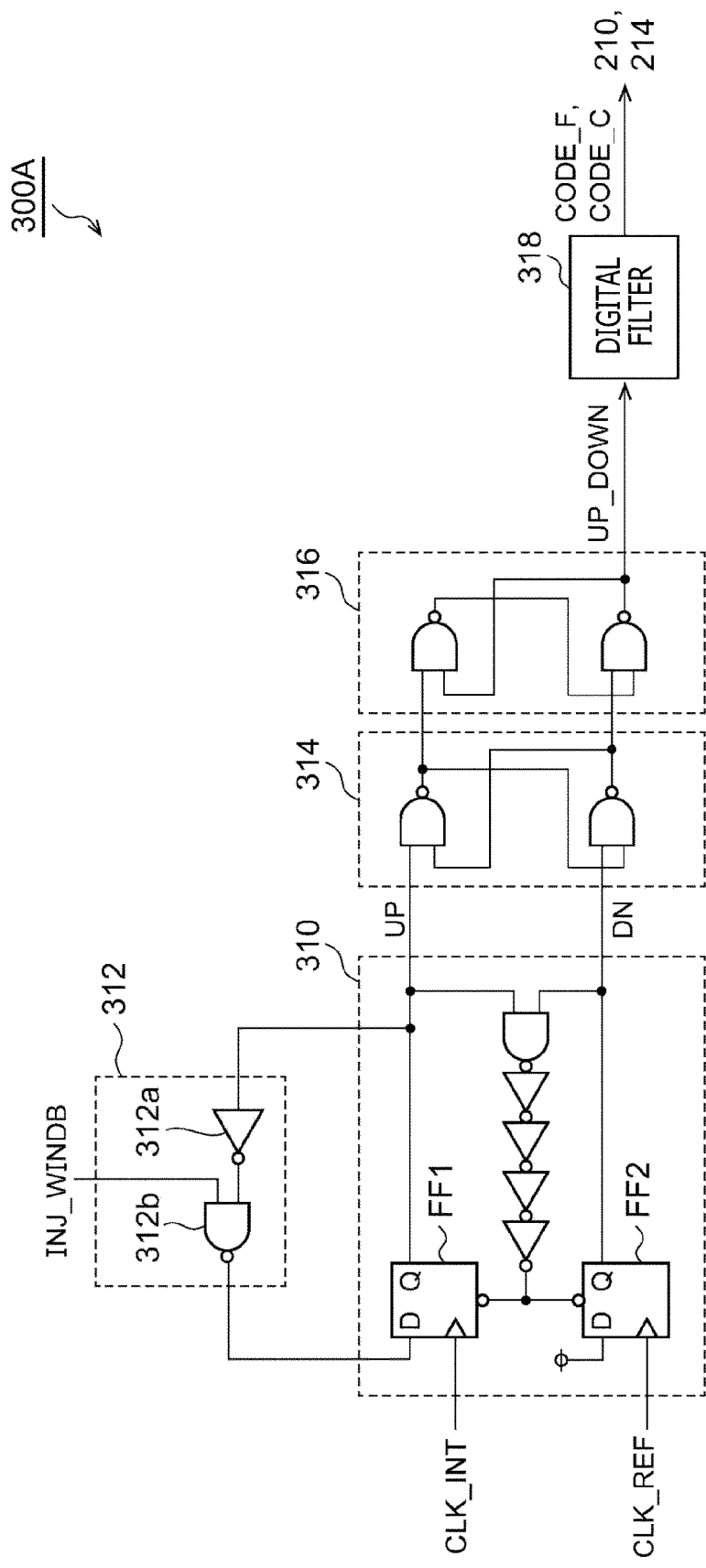
FIG. 8 is a circuit diagram of a feedback circuit according to one example.

FIG. 8 is a circuit diagram of a feedback circuit 300A according to one example. The feedback circuit 300A includes a PFD 310, a gating circuit 312, latch circuits 314 and 316, and a digital filter 318. The PFD 310 detects the phase difference and the frequency difference between the internal clock CLK_INT (or output clock CLK_DCO) and the reference clock CLK_REF and generates an up-pulse UP and a down-pulse DN according to the comparison result. The up-pulse UP and the down-pulse DN pass through the latch circuits 314 and 316 and are converted to an up-down signal UP_DOWN. The digital filter 318 is an integrator that performs integration in such a manner as to treat the high level of the up-down signal UP_DOWN as +1 and treat the low level thereof as −1, and generates control codes CODE_F and CODE_C according to the integration result.

The gating circuit 312 uses a pulse for control of the injection window, i.e., the INJ_WINDB signal, to enable the PFD 310 during the period in which the INJ_WINDB signal is asserted (low) and disable the PFD 310 during the period in which the INJ_WINDB signal is negated (high).

The gating circuit 312 in FIG. 8 may include an inverter 312a and a NAND gate 312b and fix one input D of a flip-flop FF1 at the first stage of the PFD 310 to the low level during the period in which the INJ_WINDB signal is negated. In a general PFD, the CLK_DCO signal is input through the frequency divider, and therefore, a phase offset arises between the CLK_DCO signal and the injection edge due to delay thereof. In the injection-locked PLL, this phase offset causes increase in the reference spurious and therefore becomes a problem. However, disposing the gating circuit 312 makes the frequency divider unnecessary and enables the CLK_INT (CLK_DCO) signal to be directly input to the flip-flop FF1. As a result, the delay difference between the reference edge CLK_REF and the internal clock CLK_INT is eliminated, and the reference spurious can be reduced through minimization of the phase error. The configuration of the gating circuit 312 is not limited to that of FIG. 8.

FIGS. 9A and 9B are diagrams for explaining operation of the feedback circuit 300A of FIG. 8. FIG. 9A illustrates the input-output characteristic of the feedback circuit 300A, and FIG. 9B illustrates operation waveforms of the feedback circuit 300A. As illustrated in FIG. 9B, pulses of the INJ_WINDB signal function as a mask signal, and phase comparison is carried out only in the sections in which the INJ_WINDB signal is low, that is, with limitation to the periods in which the window for edge injection is open. As a result, the phase pull-in range can be enlarged as illustrated in FIG. 9A. This means that an FLL circuit is unnecessary, and it is possible to use the output of the digital filter 318 for control of the first delay circuit 212 and the second delay circuit 214.

An FLL circuit may be added to the feedback circuit 300A of FIG. 8, and the amount of delay of the first delay circuit 212 may be controlled on the basis of the output of the FLL circuit. This can shorten the time until frequency locking and phase locking. In this case, a somewhat large frequency error is covered by the feedback circuit 300A in which the phase pull-in range is enlarged. Therefore, the frequency detection accuracy of the added FLL circuit may be low. For this reason, the area can be made small and/or the power consumption can be made low.

Figure 10:
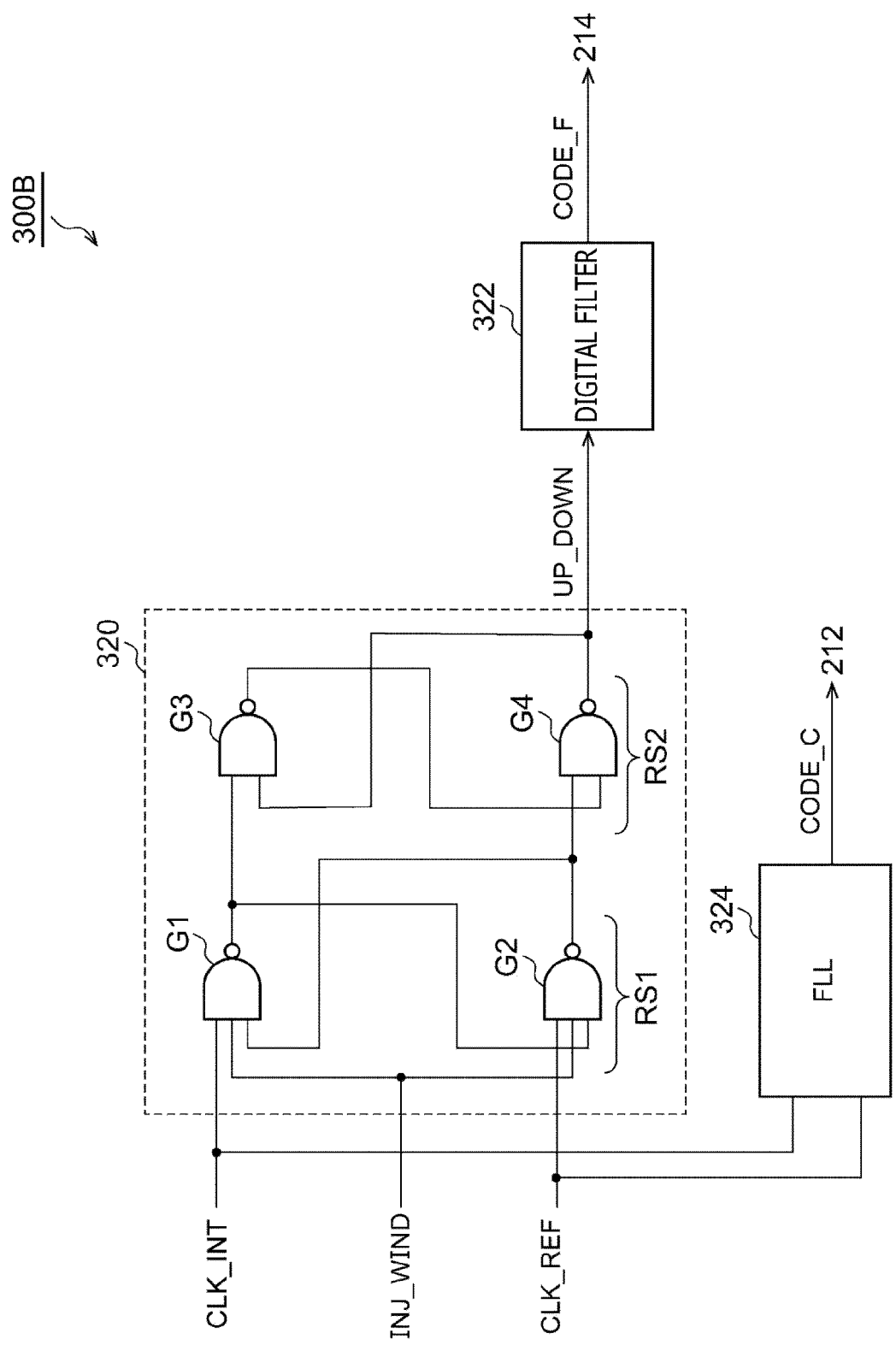
FIG. 10 is a circuit diagram of a feedback circuit according to one example.

FIG. 10 is a circuit diagram of a feedback circuit 300B according to one example. The feedback circuit 300B includes a symmetric phase detector (PD) 320, a digital filter 322, and an FLL circuit 324.

The symmetric PD 320 includes four NAND gates G1 to G4. A pair of two NAND gates G1 and G2 at the first stage configure a NAND RS latch. A pulse for control of the injection window, i.e., an INJ_WIND signal, is input to an RS latch RS1 at the first stage, and the configuration is made in such a manner that the RS latch is enabled only during the period in which the window defined by the INJ_WIND signal is open and the RS latch is disabled during the period in which the window is closed. In the example of FIG. 10, the NAND gates G1 and G2 are configured with three inputs, and the INJ_WIND signal is input to each of them. The INJ_WIND signal is in the logically-inverted relation with the INJ_WINDB signal.

The output of the RS latch RS1 at the first stage is input to an RS latch RS2 formed by a pair of two NAND gates G3 and G4 at the subsequent stage and is converted to the up-down signal UP_DOWN.

The digital filter 322 is an integrator that performs integration in such a manner as to treat the high level of the up-down signal UP_DOWN as +1 and treat the low level thereof as −1, and generates the control code CODE_F according to the integration result. The control code CODE_F is supplied to the second delay circuit 214.

The FLL circuit 324 generates the control code CODEC in such a manner that the frequency of the CLK_DCO signal comes close to the frequency of the CLK_REF signal, and supplies the control code CODE_C to the first delay circuit 212.

Figure 11A:
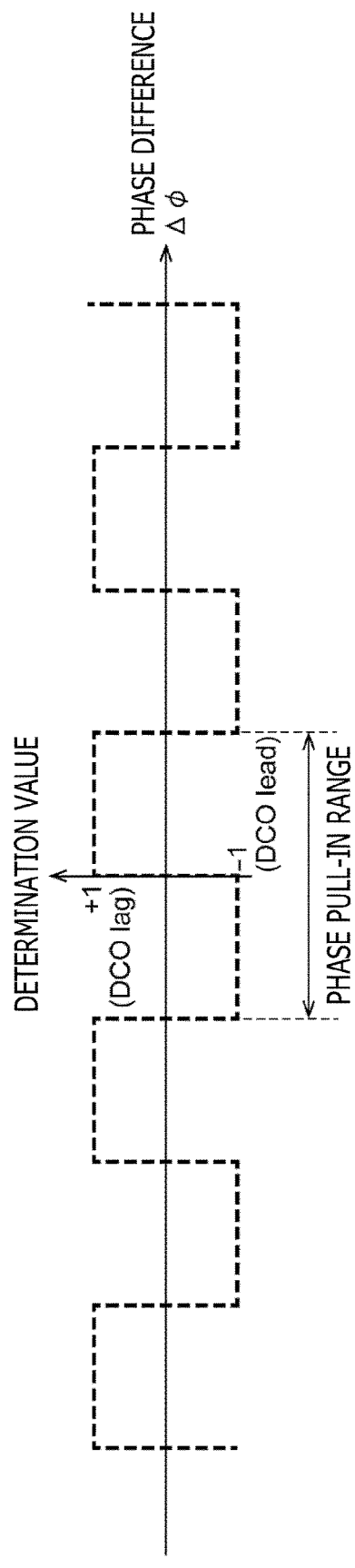
FIGS. 11A and 11B are diagrams for explaining operation of the feedback circuit of FIG. 10.
Figure 11B:
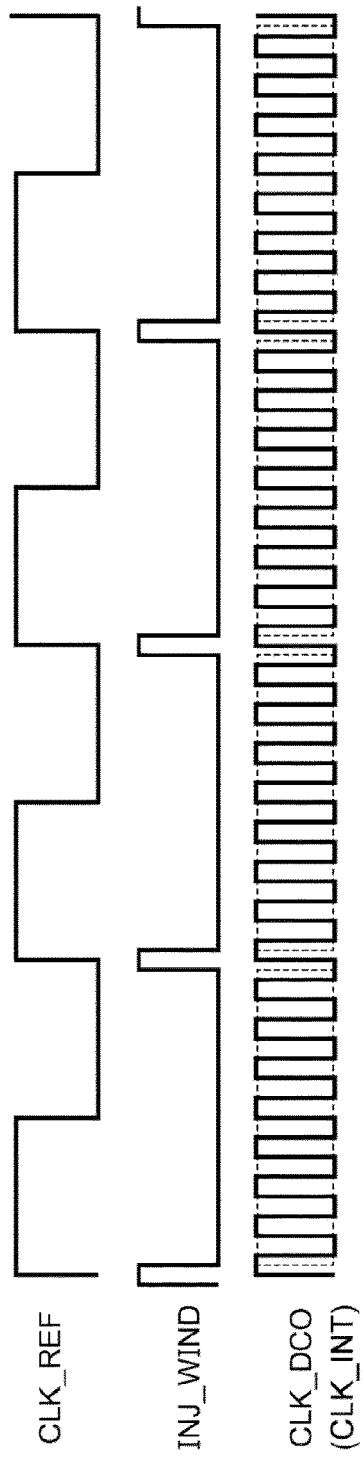

FIGS. 11A and 11B are diagrams for explaining operation of the feedback circuit 300B of FIG. 10. FIG. 11A illustrates the input-output characteristic of the feedback circuit 300B, and FIG. 11B illustrates operation waveforms of the feedback circuit 300B. As illustrated in FIG. 11B, pulses of the INJ_WIND signal function as a mask signal, and phase comparison is carried out only in the sections in which the INJ_WIND signal is high, that is, with limitation to the periods in which the window for edge injection is open.

The symmetric PD 320 used in the feedback circuit 300B of FIG. 10 has advantages that the phase mismatch is small, that the high-speed operation is possible, and that the power consumption is low.

Advantages of the feedback circuit 300B become clear through comparison with the related art described in H. Ngo, et al., "A 0.42ps-Jitter-241.7 dB-FOM Synthesizable Injection-Locked PLL with Noise-Isolation LDO," ISSCC, pp. 150-151, 2017. In the related art described in H. Ngo, et al., "A 0.42ps-Jitter-241.7 dB-FOM Synthesizable Injection-Locked PLL with Noise-Isolation LDO," ISSCC, pp. 150-151, 2017, a configuration is employed in which the mask by the INJ_WIND signal is not used and phase comparison between the reference clock CLK_REF and an internal clock of a DCO is carried out by a symmetric PD.

In the feedback circuit 300B of FIG. 10, the phase pull-in range is narrower than that of the feedback circuit 300A of FIG. 8. Therefore, the phase/frequency of the output clock CLK_DCO may need to be pulled in within the phase pull-in range of the symmetric PD 320 by the FLL circuit 324. However, the phase pull-in range of the symmetric PD 320 is N times (N is the multiplication factor) the phase pull-in range of the symmetric PD of the related art without the mask. Therefore, the frequency detection accuracy suitable for the FLL circuit can be made lower than that in the related art, and the area and the power consumption can be reduced.

Subsequently, a technique for stably stopping the system including the PLL circuit 100 will be described. The injection-locked PLL circuit 100 involves a problem that oscillation operation stops when the reference clock CLK_REF stops. If nothing is done, it is difficult to use the PLL circuit 100 for an application in which continuation of oscillation at the time of stop of the reference clock CLK_REF is also required. The configuration of a PLL circuit 100C that can continue oscillation operation even at the time of stop of the reference clock CLK_REF will be described below.

Figure 12:
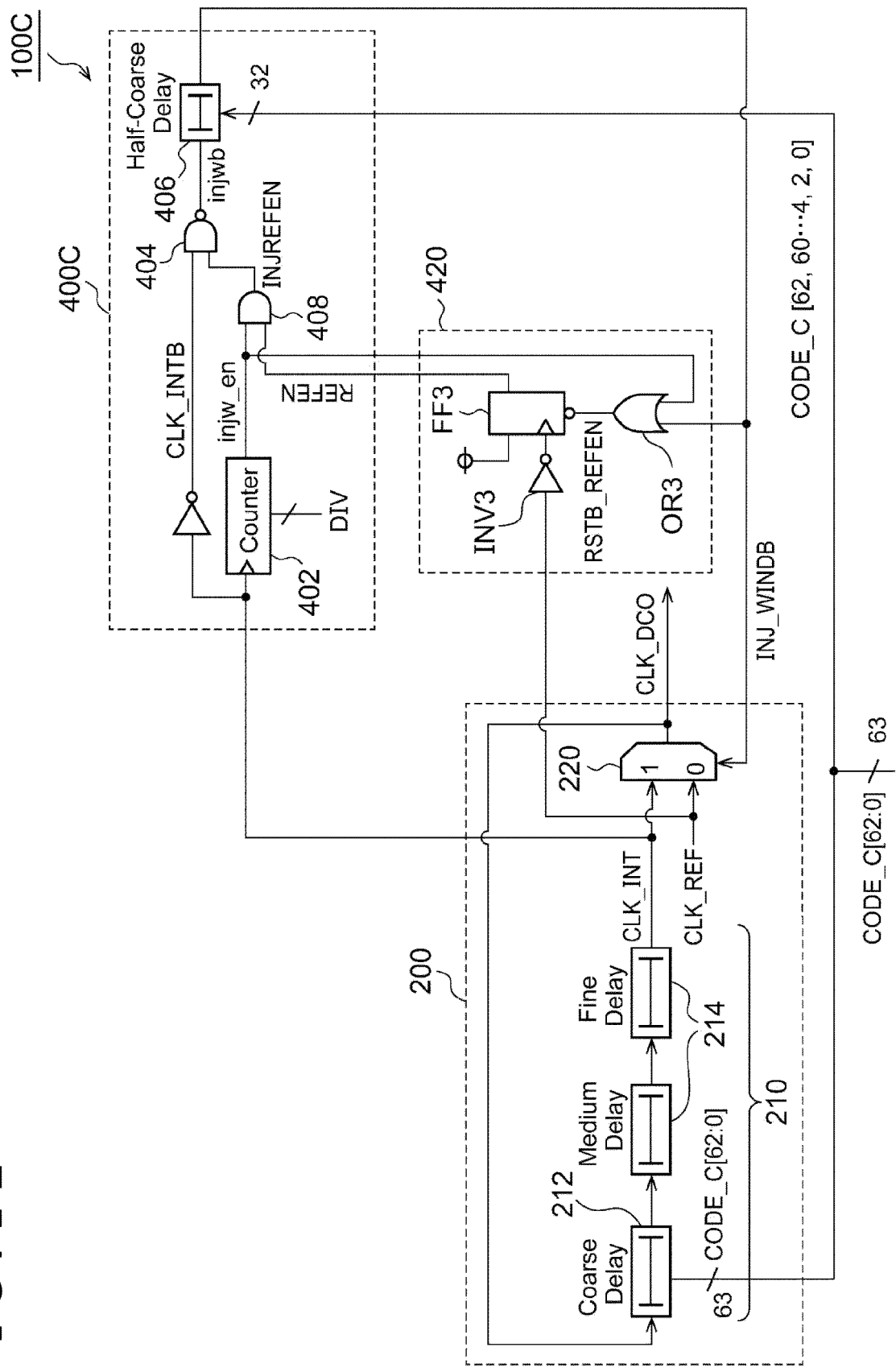
FIG. 12 is a block diagram of an improved PLL circuit.

FIG. 12 is a block diagram of the improved PLL circuit 100C. The PLL circuit 100C is configured in such a manner that the INJ_WINDB signal is fixed to the negate state when the reference clock CLK_REF stops. Due to this, at the time of stop of the reference clock CLK_REF, the multiplexer 220 continues to select the internal clock CLK_INT, and a ring oscillator is formed. Further, the control code to the variable delay circuit 210 is fixed, and the variable frequency oscillator 200 continues to oscillate at the same frequency. The feedback control of the frequency of the variable frequency oscillator 200 becomes unexecuted, and therefore, long-term accuracy is not ensured. However, while the variable frequency oscillator 200 continues to oscillate at the fixed frequency, the system in which the PLL circuit 100C is used can execute the desirable protection processing and safely shut down.

The PLL circuit 100C includes a clock monitoring circuit 420. The clock monitoring circuit 420 monitors the reference clock CLK_REF. When the reference clock CLK_REF is normally input, a clock enable signal REFEN is asserted (for example, high) every cycle. However, when the reference clock CLK_REF stops, the REFEN signal remains negated.

The system and the configuration of clock monitoring of the clock monitoring circuit 420 are not particularly limited. The REFEN signal that is asserted (high) in response to an edge (here negative edge) of the reference clock CLK_REF and becomes low in response to assertion of the INJ_WINDB signal or the injw_en signal may be generated. The clock monitoring circuit 420 can be configured with a combination of a flip-flop FF3 and logic gates OR3 and INV3.

A logic gate (here AND gate) 408 is added to a window generator 400C, and the injw_en signal is masked by the logic gate 408 on the basis of the REFEN signal.

FIG. 13 is an operation waveform diagram of the PLL circuit 100C of FIG. 12. The REFEN signal makes a transition to high every negative edge of the reference clock CLK_REF and makes a transition to low every negative edge of an RSTB_REFEN signal. Here, the RSTB_REFEN signal is the logical disjunction of the injw_en signal and the INJ_WINDB signal. Therefore, the negative edge of the RSTB_REFEN signal corresponds with the negative edge of the injw_en signal.

While the reference clock CLK_REF is normally input, the REFEN signal repeats high and low every cycle of the reference clock CLK_REF.

When the reference clock CLK_REF stops at a time $t_0$, from then on, the REFEN signal is fixed at low and the INJ_WINDB signal is fixed at high, which makes the state in which the injection window is closed. The control code to the variable delay circuit 210 is fixed at the immediately-previous value, and the oscillation frequency of the variable frequency oscillator 200, i.e., the frequency of the CLK_DCO signal and the CLK_INT signal, is fixed.

A focus will be made on the CLK_DCO signal (or CLK_INT signal) immediately after the time $t_0$. Originally, retiming of the CLK_DCO signal is carried out by the CLK_REF signal at the time $t_0$. However, when the reference clock CLK_REF stops, this retiming becomes absent. Therefore, the low period (i.e., cycle) of the CLK_DCO signal extends by the ¼ cycle in the first cycle immediately after the stop of the reference clock CLK_REF, and thereafter, the variable frequency oscillator 200 continues to oscillate at the correct frequency according to the fixed control code.

In FIG. 13, the operation when the reference clock CLK_REF has completely stopped is explained. However, the PLL circuit 100C also provides an advantageous effect in the situation in which the reference clock CLK_REF is lost only during several cycles. This effect becomes clear through comparison with the PLL circuit 100 of FIG. 4.

Suppose that the reference clock CLK_REF is lost over several cycles (here four cycles) in the PLL circuit 100 of FIG. 4. In this case, the injection window also opens every N cycles of the internal clock CLK_INT while the reference clock CLK_REF is lost. However, because the edge of the reference clock CLK_REF is not injected, the extension of the oscillation cycle (frequency variation) occurs not only in the one cycle immediately after the stop of the reference clock (immediately after the time $t_0$) but also every time during the four cycles (near a time $t_1$ in FIG. 13). Thus, the frequency variation is large. In contrast, in the PLL circuit 100C of FIG. 12, the oscillation cycle is extended only in the first one cycle at the time when the reference clock CLK_REF is lost, whereas the variable frequency oscillator 200 continues to oscillate at the correct frequency in the second and subsequent cycles (time $t_1$). Therefore, the frequency variation can be made small.

The embodiment is exemplification, and it is understood by those skilled in the art that various modification examples are possible in combinations of the respective constituent elements and that the respective processing processes of the embodiment and such modification examples also fall within the range of the present disclosure. Such a modification example will be described below.

In the embodiment, an edge of the reference clock CLK_REF is used as the injection edge. However, the configuration is not limited thereto. The reference clock CLK_REF may be multiplied, and the clock after the multiplication may be used as the injection edge.

Although the present disclosure is described on the basis of the embodiment with use of specific phrases, the embodiment merely represents the principle and application of the present disclosure. In the embodiment, many modification examples and changes in the arrangement are permitted without departing from ideas of the present disclosure defined in the scope of claims.

What is claimed is:

1. A phase locked loop circuit that is an injection-locked phase locked loop circuit, the phase locked loop circuit comprising:
a variable frequency oscillator configured in such a manner that a ring oscillator is formed during a period in which a window signal is negated and an injection edge based on a reference clock is allowed to be injected during a period in which the window signal is asserted;
a feedback circuit that controls the variable frequency oscillator in such a manner that an oscillation frequency of the variable frequency oscillator gets closer to a target frequency according to the reference clock; and
a window generator that receives an internal clock of the variable frequency oscillator and cuts out one pulse to generate the window signal.

2. The phase locked loop circuit according to claim 1, wherein
the window generator generates a pulse signal asserted during a half cycle of the internal clock, one time per N cycles (N≥2) of the internal clock, and delays the pulse signal by a period of time that is M times (0<M<1) a cycle of the internal clock to generate the window signal.

3. The phase locked loop circuit according to claim 2, wherein
M=¼ is set.

4. The phase locked loop circuit according to claim 3, wherein
the window generator includes
a counter that counts the internal clock and asserts an output during one cycle per N cycles, a logic gate that carries out logical operation of the output of the counter and the internal clock to generate the pulse signal, and a delay line that delays the pulse signal by ¼ of the cycle of the internal clock.

5. The phase locked loop circuit according to claim 4, wherein the variable frequency oscillator includes a variable delay circuit, and the delay line is a replica with a same circuit format as the variable delay circuit.

6. The phase locked loop circuit according to claim 5, wherein the delay line gives a delay that is half of a delay of the variable delay circuit.

7. The phase locked loop circuit according to claim 1, wherein the variable frequency oscillator includes
a variable delay circuit, and
a multiplexer that receives the internal clock that is an output of the variable delay circuit at one input, receives the injection edge at the other input, has an output connected to an input of the variable delay circuit, and selects one of the internal clock and the injection edge according to the window signal.

8. The phase locked loop circuit according to claim 7, wherein the window generator includes a replica of the multiplexer through which the window signal passes.

9. The phase locked loop circuit according to claim 7, wherein the multiplexer includes
a first NAND gate that receives the internal clock at a first input and receives the window signal at a second input,
a second NAND gate that receives the reference clock at a first input and receives the inverted window signal at a second input,
a third NAND gate that receives an output of the first NAND gate at a first input and receives an output of the second NAND gate at a second input, and
a fourth NAND gate that receives the output of the first NAND gate at a first input, receives the output of the second NAND gate at a second input, and has an output connected to an output of the third NAND gate.

10. The phase locked loop circuit according to claim 5, wherein the variable delay circuit includes
a first delay circuit that gives a coarse delay, and
a second delay circuit that gives a delay shorter than an amount of delay corresponding to 1 LSB of the first delay circuit, and the delay line includes a replica of the first delay circuit, and the replica is given a second control code having values of ½ of values of a first control code given to the first delay circuit.

11. The phase locked loop circuit according to claim 1, wherein the reference clock is directly injected as the injection edge.

12. The phase locked loop circuit according to claim 1, wherein the feedback circuit includes
a symmetric phase detector that becomes an enabled state to compare phases of the reference clock and a clock signal generated by the variable frequency oscillator and generate an up-down signal that indicates a comparison result, during a period in which the window signal is asserted, and
a digital filter that generates a control code according to the up-down signal.

13. The phase locked loop circuit according to claim 1, wherein the feedback circuit includes
a phase frequency detector that becomes an enabled state to compare phases and frequencies of the reference clock and a clock signal generated by the variable frequency oscillator and generate an up-pulse and a down-pulse that indicates a comparison result, during a period in which the window signal is asserted, and
a digital filter that generates a control code according to an up-down signal based on the up-pulse and the down-pulse.

14. The phase locked loop circuit according to claim 1, wherein the window generator keeps the window signal negated when it is difficult to detect an edge of the reference clock.

15. The phase locked loop circuit according to claim 4, further comprising:

a clock monitoring circuit configured to generate a clock enable signal that is asserted when the reference clock is normally input and is negated when the reference clock stops, wherein the output of the counter is masked according to the clock enable signal.

* * * * *